(12) United States Patent
Heller et al.

(10) Patent No.: US 10,566,957 B1
(45) Date of Patent: Feb. 18, 2020

(54) CURRENT-MODE LOGIC LATCHES FOR A PVT-ROBUST MOD 3 FREQUENCY DIVIDER

(71) Applicant: SEMICONDUCTOR COMPONENTS INDUSTRIES, LLC, Phoenix, AZ (US)

(72) Inventors: Tom Heller, Karmiel (IL); Jakob Vovnoboy, Yakir (IL)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/447,404

(22) Filed: Jun. 20, 2019

Related U.S. Application Data (60) Provisional application No. 62/830,997, filed on Apr. 8, 2019.

(51) Int. Cl.
| | | |
|---|---|---|
| *H03K 3/011* | (2006.01) | |
| *H03K 5/00* | (2006.01) | |
| *H03K 3/037* | (2006.01) | |
| *H03K 19/20* | (2006.01) | |

(52) U.S. Cl.
CPC .......... *H03K 3/011* (2013.01); *H03K 3/037* (2013.01); *H03K 5/00006* (2013.01); *H03K 19/20* (2013.01)

(58) Field of Classification Search
None
See application file for complete search history.

(56) References Cited

U.S. PATENT DOCUMENTS

| | | | | |
|---|---|---|---|---|
| 6,737,899 B2* | 5/2004 | Sudjian | ................ | H03K 3/012 327/208 |
| 8,497,723 B2* | 7/2013 | Zhuang | ............. | H03K 3/35625 327/212 |
| 8,680,899 B2* | 3/2014 | Soe | ........................ | H03L 7/193 327/115 |

(Continued)

FOREIGN PATENT DOCUMENTS

WO    2015065683 A1    5/2015

OTHER PUBLICATIONS

Behzad Razavi, RF Microelectronics, 2nd Edition, "Integer-N Frequency Synthesizers—Divider Logic Styles," Chapter 10, Sec. 10.6.4, 2012, pp. 683-684.

(Continued)

*Primary Examiner* — Jeffery S Zweizig
(74) *Attorney, Agent, or Firm* — Ramey & Schwaller, LLP (57) ABSTRACT

An illustrative digital latch includes: a differential transistor pair ("track pair") capacitively coupled to a differential input signal to cause a differential output voltage between output nodes to track the differential input signal when a clock signal is asserted; a cross-coupled transistor pair ("latch pair") coupled to the output nodes to latch the differential output voltage when the clock signal is de-asserted; a differential transistor pair ("clock pair") that steers a bias current between the track pair and the latch pair; and a matched set of bias transistors that determines the bias current for the clock pair and a reference voltage on a reference voltage node, the reference voltage node being coupled to a base of each transistor in the track pair by equal bias resistances.

20 Claims, 5 Drawing Sheets

(56) References Cited

U.S. PATENT DOCUMENTS

2009/0284288 A1    11/2009   Zhang et al.
2014/0159782 A1    6/2014   Kennedy et al.
2015/0116011 A1    4/2015   Atesoglu

OTHER PUBLICATIONS

Arzu Ergintav et al., "Low-Power and Low-Noise Programmable Frequency Dividers in a 130 nm SiGe BiCMOS Technology," IEEE, 978-1-5090-4991-2/17, 2017, pp. 105-108.

Gregor Hasenacker et al., "An 8 Bit Programmable 18 GHz Frequency Divider for mm-Wave Frequency Synthesis," Proceedings of the 7th European Microwave Integrated Circuits Conference, EuMA 978-2-87487-028-6, Oct. 2012, pp. 305-308.

G. Hasenacker et al., "A 57 GHz Programmable Frequency Divider for Fractional-N Frequency Synthesizers," IEEE BCTM 3.3, IEEE 978-1-4799-0129-6/13, 2013, pp. 45-48.

Yingying Fu et al., "A 108-GHz Retimer Based on 1.8V Quasi-ECL MOS-HBT SiGe BiCMOS Logic," 2013 IEEE Compound Semiconductor Integrated Circuit Symposium (CSICS); 2013, 4 pages.

\* cited by examiner

CURRENT-MODE LOGIC LATCHES FOR A PVT-ROBUST MOD 3 FREQUENCY DIVIDER

CROSS-REFERENCE TO RELATED APPLICATIONS

This application claims the benefit of U.S. Provisional Patent Application No. 62/830,997, filed on Apr. 8, 2019, the entire contents of which is incorporated herein by reference.

BACKGROUND

Frequency dividers are often implemented as digital state machines. Alternatives to digital logic dividers include injection-locked frequency dividers (ILFDs) and regenerative dividers (also known as Miller dividers). However, ILFDs typically exhibit a narrow, process-sensitive frequency range. Regenerative dividers are not suitable for a modulus value of 3, which is the focus of this document. For prescaler frequency dividers, the modulus is typically 2 or 3, with higher values being achieved using a cascade of several dividers. A required modulus value of 3 often results from a combination of factors including the frequency of the reference oscillator, the frequency band of operation, and constraints related to a delta-sigma modulator. For example, design constraints of a high-frequency fractional-N phase-locked loop suitable for a 20 GHz chirp synthesizer in an automotive radar environment may require a modulo-3 frequency divider at the output of the voltage controlled oscillator (VCO).

At relatively low frequencies, dividers can be implemented using standard CMOS (complementary metal-oxide-silicon) logic. At input frequencies above, say, 2 GHz, standard CMOS logic does not perform satisfactorily. For high frequencies, faster current-mode logic (CML) is preferred. This preference is particularly acute for digital modulo-3 frequency dividers, which are inherently slower than similar digital modulo-2 frequency dividers. Whereas a modulo-2 divider can be implemented using a single delay flip-flop, a modulo-3 divider requires a chain of two such flip flops and a NOR or NAND gate.

The maximum operating frequency of CML frequency dividers is roughly proportional to the inverse of the total open-loop delay of the CML blocks. Although there are techniques to minimize the CML block delays and thereby increase the maximum operating frequency, they generally incur one or more of the following penalties: (a) low yield due to process variation sensitivity and device mismatch; (b) failure at elevated temperatures; (c) performance sensitivity to variations in supply voltage; and (d) degradation of device reliability resulting in low mean-time-to-failure (MTTF).

SUMMARY

Accordingly, there are disclosed herein current-mode logic (CML) latches with associated modulo-3 frequency dividers and frequency division methods enabling an improved tradeoff between yield, reduced sensitivity to temperature and supply voltage variations, improved reliability, and enhanced maximum operating frequency. In one illustrative integrated circuit embodiment, a digital latch includes: a differential transistor pair ("track pair") capacitively coupled to a differential input signal to cause a differential output voltage between output nodes to track the differential input signal when a clock signal is asserted; a cross-coupled transistor pair ("latch pair") coupled to the output nodes to latch the differential output voltage when the clock signal is de-asserted; a differential transistor pair ("clock pair") that, responsive to the clock signal, steers a bias current between a shared emitter node of the track pair and a shared emitter node of the latch pair; and a matched set of bias transistors each having a base coupled by a respective base resistance to a shared bias voltage node. The matched set includes: a first bias transistor that determines the bias current for the clock pair; and a second bias transistor that sources or sinks an equal bias current through a load resistance to determine a reference voltage on a reference voltage node, the reference voltage node being coupled to a base of each transistor in the track pair by a bias resistance proportional to each of said base resistances to provide a bias voltage.

In another illustrative embodiment, a modified digital latch includes: an input transistor arrangement, a latch pair, a clock pair, and a matched set of bias transistors. The input transistor arrangement includes: a first input transistor having a base capacitively coupled to receive a first input signal; a second input transistor having a base capacitively coupled to receive a second input signal; and a complementary transistor having a base capacitively coupled to a fixed voltage node, the input transistor arrangement producing a differential output voltage between output nodes when a clock signal is asserted, the differential output voltage representing a logical NOR of the first and second input signals. The latch pair is a cross-coupled transistor pair coupled to the output nodes to latch the differential output voltage when the clock signal is de-asserted. The clock pair is a differential transistor pair that, responsive to the clock signal, steers a bias current between a shared emitter node of the track pair and a shared emitter node of the latch pair. The matched set of bias transistors each have a base coupled by a respective base resistance to a shared bias voltage node, with: a first bias transistor that determines the bias current for the clock pair; and a second bias transistor that sources or sinks an equal bias current through a load resistance to determine a reference voltage on a reference voltage node, the reference voltage node being coupled to a base of each transistor in the input transistor arrangement by a bias resistance proportional to each of said base resistances to provide a bias voltage.

In an illustrative method embodiment for manufacturing a digital latch, the method includes: capacitively coupling bases of a differential transistor pair ("track pair") to a differential input signal to cause a differential output voltage between output nodes to track the differential input signal when a clock signal is asserted; connecting a cross-coupled transistor pair ("latch pair") to the output nodes to latch the differential output voltage when the clock signal is de-asserted; providing a differential transistor pair ("clock pair") that, responsive to the clock signal, steers a bias current between a shared emitter node of the track pair and a shared emitter node of the latch pair; and biasing with a matched set of bias transistors each having a base coupled by a respective base resistance to a shared bias voltage node. The matched set includes: a first bias transistor that determines the bias current for the clock pair; and a second bias transistor that sources or sinks an equal bias current through a load resistance to determine a reference voltage on a reference voltage node, the reference voltage node being coupled to a base of each transistor in the track pair by a bias resistance proportional to each of said base resistances to provide a bias voltage.

Each of the foregoing embodiments may be employed together with any one or more of the following optional features: 1. a voltage on the shared bias voltage node is determined by a bandgap or a proportional-to-temperature (PTAT) voltage reference. 2. each of the output nodes is coupled to a supply voltage by a pull-up resistance equal to the load resistance. 3. a first pair of emitter-follower-configured transistors that amplify the clock signal to drive gates of the transistors in the clock pair, the emitter-follower-configured transistors being biased by respective bias transistors in the matched set. 4. a second pair of emitter-follower-configured transistors that buffer the differential output voltage for output, the emitter-follower-configured transistors in the second pair each being biased by respective bias transistors in the matched set. 5. at least one of the transistors in the clock pair is implemented with a triple-well architecture. 6. a choke resistor that reverse-biases an isolation well in the triple-well architecture. 7. a first master latch coupled to provide said differential input signal to said digital latch to implement a first flip flop. 8. a second flip flop including: a second master latch; and a slave latch capacitively coupled to receive output from the second master latch and coupled to provide a capacitively coupled differential input signal to the first master latch. 9. the second master latch is capacitively coupled to receive a first output signal from the digital latch and capacitively coupled to receive a second output signal from the slave latch. 10. the second master latch produces a third output signal that is a logical NOR of the first output signal and the second output signal. 11. a slave latch coupled to the modified digital latch to implement a flip flop, the flip flop providing a differential output between a positive output node and a negative output node. 12. the positive output node is coupled to the first input transistor as the first input signal, and wherein the modified digital latch further comprises a third input transistor having a base capacitively coupled to the negative output node to match loading of the positive output node. 13. coupling each of the output nodes to a supply voltage by a pull-up resistance equal to the load resistance. 14. implementing the clock pair using a triple-well architecture; and reverse-biasing an isolation well in the triple-well architecture via a choke resistor. 15. using bias transistors from the matched set to bias a first pair of emitter-follower-configured transistors that amplify the clock signal to drive gates of the transistors in the clock pair, and to bias a second pair of emitter-follower-configured transistors that amplify the differential output voltage for output.

It should be understood that the drawings and corresponding detailed description do not limit the disclosure, but on the contrary, they provide the foundation for understanding all modifications, equivalents, and alternatives falling within the scope of the appended claims.

DETAILED DESCRIPTION

Figure 1A:
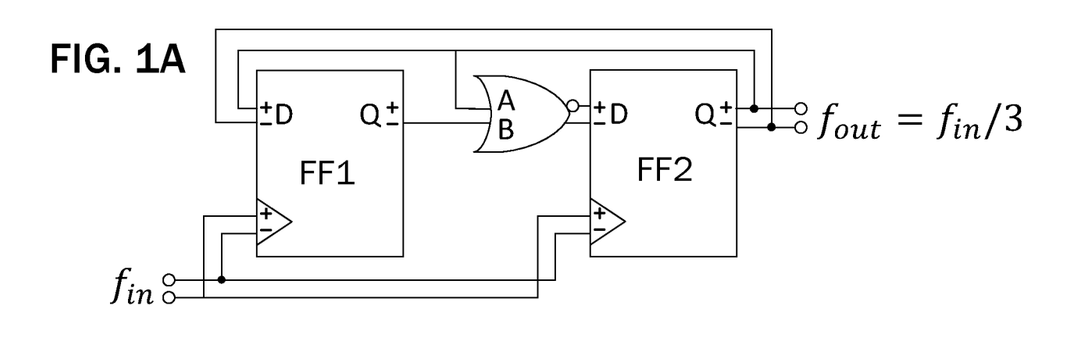
FIG. 1A is a block diagram of an illustrative digital modulo-3 frequency divider.

FIG. 1A is a block diagram of an illustrative digital modulo-3 frequency divider. The divider is implemented as a digital state machine using two flip-flops (FF1, FF2) in combination with a NOR logic gate. The flip-flops of the illustrated divider accept differential signals at their clock and data inputs, and one or both of the flip-flops provide a differential signal as their state outputs. A differential frequency signal $f_{in}$ is provided to the clock input of flip-flop FF1, and provided in an inverted form to the clock input of flip-flop FF2, so that the two flip-flops latch in alternation. The data input D for flip-flop FF1 is the state output Q from flip-flop FF2. The NOR logic gate combines the state output Q from flip-flop FF1 with the state output Q from flip-flop FF2, producing a differential signal NOT($Q_{FF1}$ OR $Q_{FF2}$) that is supplied to the data input D for flip-flop FF2. In one contemplated embodiment, the NOR logic gate produces the differential output signal from single-ended inputs. As the input frequency signal $f_{in}$ oscillates, the state output Q from FF2 serves as an output frequency signal $f_{out}$ which is asserted once for every three cycles of the input signal $f_{in}$, thereby providing the desired modulo-3 frequency division.

Figure 1B:
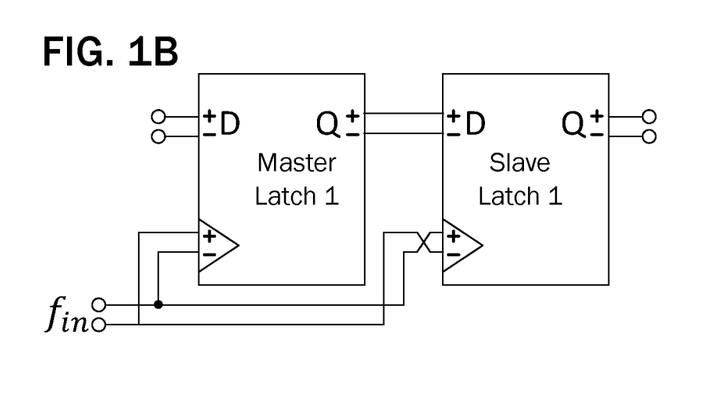
FIG. 1B is a block diagram of an illustrative delay flip-flop.

Each of the flip-flops FF1, FF2, may be implemented with a master latch and a slave latch. FIG. 1B is a block diagram of flip-flop FF1, showing the state output Q of the master latch coupled to data input D of the slave latch, and the input frequency signal $f_{in}$ coupled to the clock input of the master latch and coupled in an inverted fashion to the clock input of the slave latch. The latches operate in alternation, with the slave latch holding and driving the flip-flop's state output Q while the master latch acquires the flip-flop's data input D, and the master latch holding and driving the obtained data input while the slave latch acquires it.

Figure 1C:
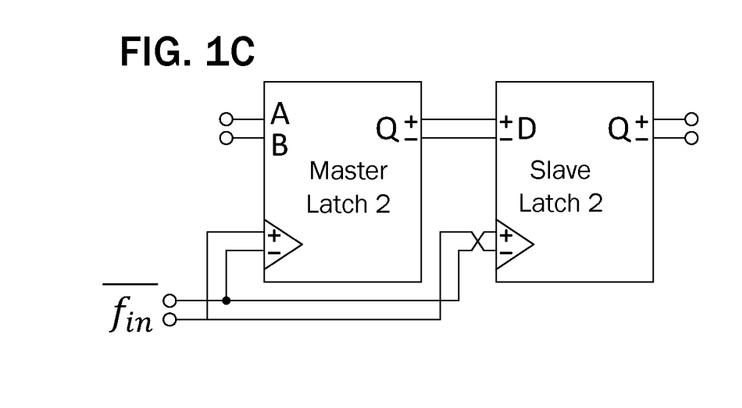
FIG. 1C is a block diagram of an illustrative delay flip-flop with an integrated NOR input logic gate.

Rather than implement flip-flop FF2 in exactly the same way, FF2 is implemented with a modified master latch as indicated in FIG. 1C. The modified master latch incorporates the function of the NOR logic gate; hence the data input D is replaced by the inputs A and B for the NOR logic. This modification reduces the divider's open-loop delay and enables a higher maximum operating frequency. As with FIG. 1B, the state output Q of the master latch is coupled to data input D of the slave latch, and the inverted input frequency signal $f_{in}$ is coupled to the clock input of the master latch and coupled in a non-inverted fashion to the clock input of the slave latch. The latches operate in alternation, with the slave latch holding and driving the flip-flop's state output Q while the master latch acquires the flip-flop's logically-combined data inputs A, B, and the master latch holding and driving the obtained NOR operation's result while the slave latch acquires it.

Thus, the illustrated implementation of the frequency divider includes three "regular" latches and one modified latch having the NOR logic function integrated into its input circuitry.

Figure 1D:
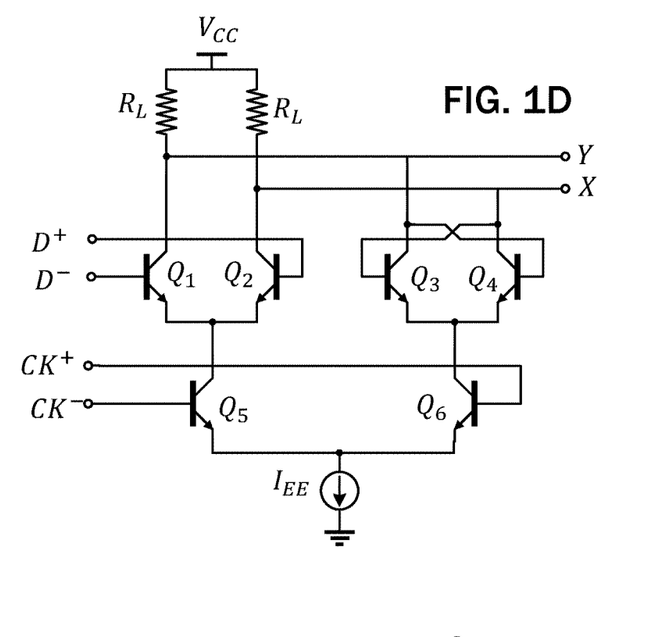
FIG. 1D is a schematic of an illustrative current-mode logic (CML) latch.

FIG. 1D is a schematic of a "regular" latch implemented using current-mode logic (CML). It includes a differential transistor pair Q1, Q2 that, when transistor Q5 is ON, cause output nodes X,Y to track the state of data inputs +D, −D. Differential transistor pair Q1, Q2 may accordingly be termed a "track pair". Each of the output nodes X,Y is biased by a load resistor $R_L$ coupled between the output node and the supply voltage $V_{CC}$. The track pair transistors Q1, Q2 share a source node that is coupled by transistor Q5 to a current sink $I_{EE}$ when the clock signal CK is asserted.

The latch further includes a cross-coupled transistor pair Q3, Q4, that when transistor Q6 is ON, latches the states of output nodes X,Y. Transistor pair Q3, Q4 may accordingly be termed a "latch pair". The latch pair transistors Q3, Q4 share an emitter node that is coupled by transistor Q6 to the current sink $I_{EE}$ when the clock signal CK is de-asserted.

Transistors Q5, Q6 respond to the clock signal CK to switch the sink current between the track pair and the latch pair, thereby enabling the latch to alternately acquire and hold the differential data input signal D in the state of the output nodes X,Y.

Figure 1E:
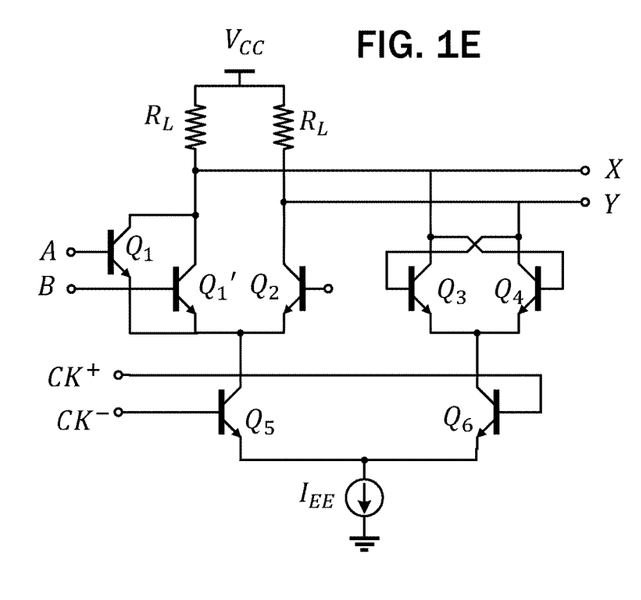
FIG. 1E is a schematic of an illustrative CML latch with an integrated NOR input logic gate.

Relatedly, FIG. 1E is a schematic of a modified latch implemented using CML. In the modified latch, the track pair is modified to integrate the NOR functionality. The latch and clock pairs are unchanged relative to the regular latch implementation of FIG. 1D.

The track pair is modified as follows: the base of transistor Q2 is coupled to a bias voltage Vb intermediate to the voltages representing a Boolean "1" and a Boolean "0". The transistor Q1 of the "regular" latch implementation is replaced in FIG. 1E by two parallel transistors Q1 and Q1' having their bases coupled to the gate input signals A and B, respectively. If either input signal A or B (or both) is asserted while transistor Q5 is ON, the output node X is pulled low, thereby implementing the NOR function. Otherwise it remains high due to the pull-up resistor $R_L$. Due to the differential configuration, output node Y moves inversely to output node X while transistor Q5 is ON, thereby converting the gate output into a differential signal suitable for capture by the latch pair when transistor Q6 turns ON.

It should be noted that the input signals A and B are generated by flip-flops while the bias voltage Vb is generated by a different circuit type that typically fails to ensure the bias voltage consistently equals the average (DC) voltage of the input signals. Rather, the difference in physical mechanisms causes this mismatch to be sensitive to supply voltage, temperature, and process variations. For example, the bias voltage may be generated by dropping a reference current across a reference resistor, making the bias voltage sensitive to the supply voltage and to resistor process variations. The input signals may be provided as outputs of emitter followers, causing their DC voltage to depend on transistor bias currents and base voltages, which in turn depend indirectly on their load resistors, the supply voltage, and temperature. The DC offsets vary significantly over the expected ranges of supply voltage, temperature, and process variations, the sensitivity of the latch pair to these effects worsens as the signal frequency increases and the input signal amplitude drops.

In some embodiments the clock pair transistors may be implemented as N-channel metal-oxide-semiconductor field effect transistors (nMOSFETs) to minimize their headroom requirements. However, it is noted that the clock pair transistors do not have their sources connected to ground. To prevent the undesirable body effect, the clock pair transistors may be implemented using a triple well structure similar to that shown in FIG. 1F.

Figure 1F:
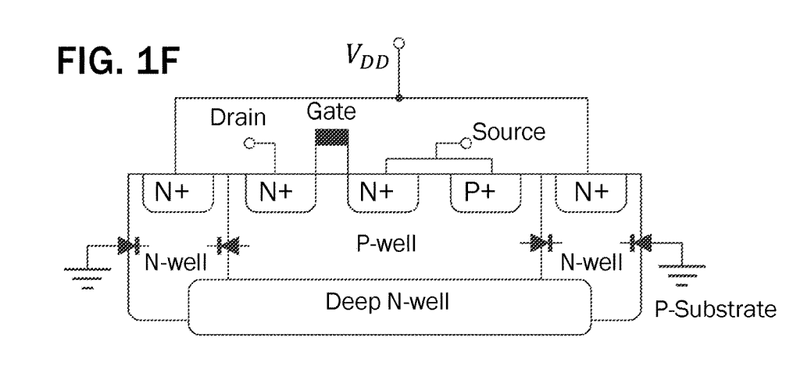
FIG. 1F is a side view of an illustrative triple-well architecture.

FIG. 1F is a side view of an illustrative triple-well architecture, in which the source and drain wells are contained within a p-type body well, which in turn is bounded on all sides by an n-type isolation well that isolates the transistor body from the p-type substrate. To isolate the body well from the substrate, the isolation well is reverse-biased with respect to the body well and to the substrate. FIG. 1F shows the substrate being connected to ground and the isolation well being connected to the supply voltage $V_{DD}$. (The voltage of the body well will not exceed the supply voltage $V_{DD}$.) When a positive voltage is applied to the gate, negative charge carriers collect below the oxide, forming a conductive n-channel between the source and the drain. In accordance with industry practice, the source is also provided an ohmic connection to the body well (via the P+ well). Note that the triple well architecture can be modeled using a pair of reverse-biased parasitic diodes that separate the body well from the substrate. This representation will be employed in schematics below.

Reverse-biased diodes exhibit capacitive behavior for high frequency signals. We observe here that connecting the isolation well to the supply voltage $V_{DD}$ provides a low impedance path that may cause significant signal attenuation at high frequencies. To address this and other issues raised by the naïve implementations set forth above, we now set forth various enhancements to provide a modulo-3 frequency divider with enhanced robustness to PVT (process, voltage, and temperature) variations.

Figure 2:
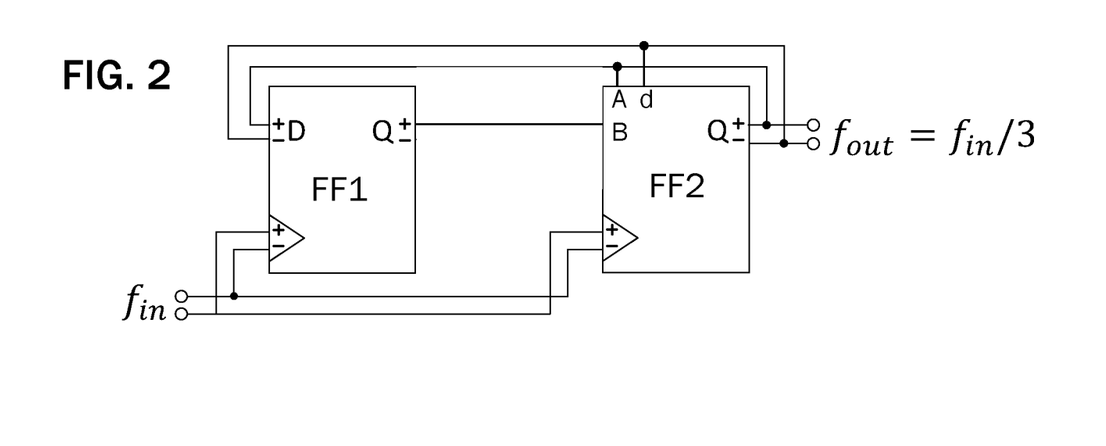
FIG. 2 is a block diagram of an illustrative digital modulo-3 frequency divider with output signal balancing.

FIG. 2 is a block diagram of an illustrative digital modulo-3 frequency divider with output signal balancing. Unlike the embodiment of FIG. 1A, where the NOR logic gate unbalances the loading between the output signal nodes, the embodiment of FIG. 2 employs a modified flip-flop FF2 that rebalances the loading of the output signal nodes with a dummy load input d matched to the input impedance for input signal A. An illustrative implementation for the dummy load is described below with reference to the schematic of FIG. 5.

Figure 3:
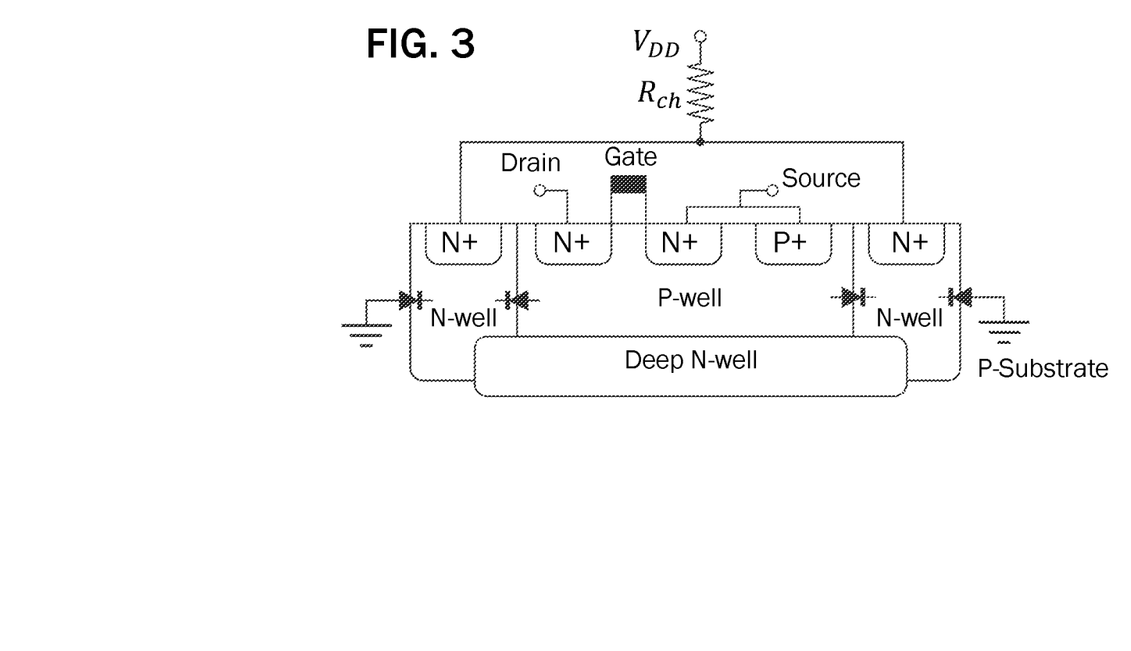
FIG. 3 is a side view of an illustrative triple-well architecture with choke resistance biasing.

Before turning to the schematics, however, we first discuss a preferred biasing technique for the triple well architecture as shown in FIG. 3. Rather than maintaining the reverse-biasing of the isolation well with a direct connection to the supply voltage $V_{DD}$, the embodiment of FIG. 3 employs a choke resistor Rch to couple the supply voltage to the isolation well. So long as the choke resistance is comparable in magnitude to, or larger than, the impedance of the parasitic diode capacitance at the operating frequency, the total impedance of the leakage paths is nearly doubled and the attenuation of high frequency signals is significantly reduced. (Further improvement may be achievable by reducing the bulk conductivity of the substrate, thereby increasing the impedance of the path from the body well to ground via the isolation well and substrate.) The choke resistance is preferably set as high as possible while still ensuring that the isolation well is reverse biased over the expected source and drain voltage swings of the clock pair transistors.

In some contemplated implementations, each of the clock pair transistors has its own isolation well, such that a choke resistor is used for each isolation well. In other contemplated embodiments, a single isolation well is used for both of the clock pair transistors so that only a single choke resistor is used.

Figure 4:
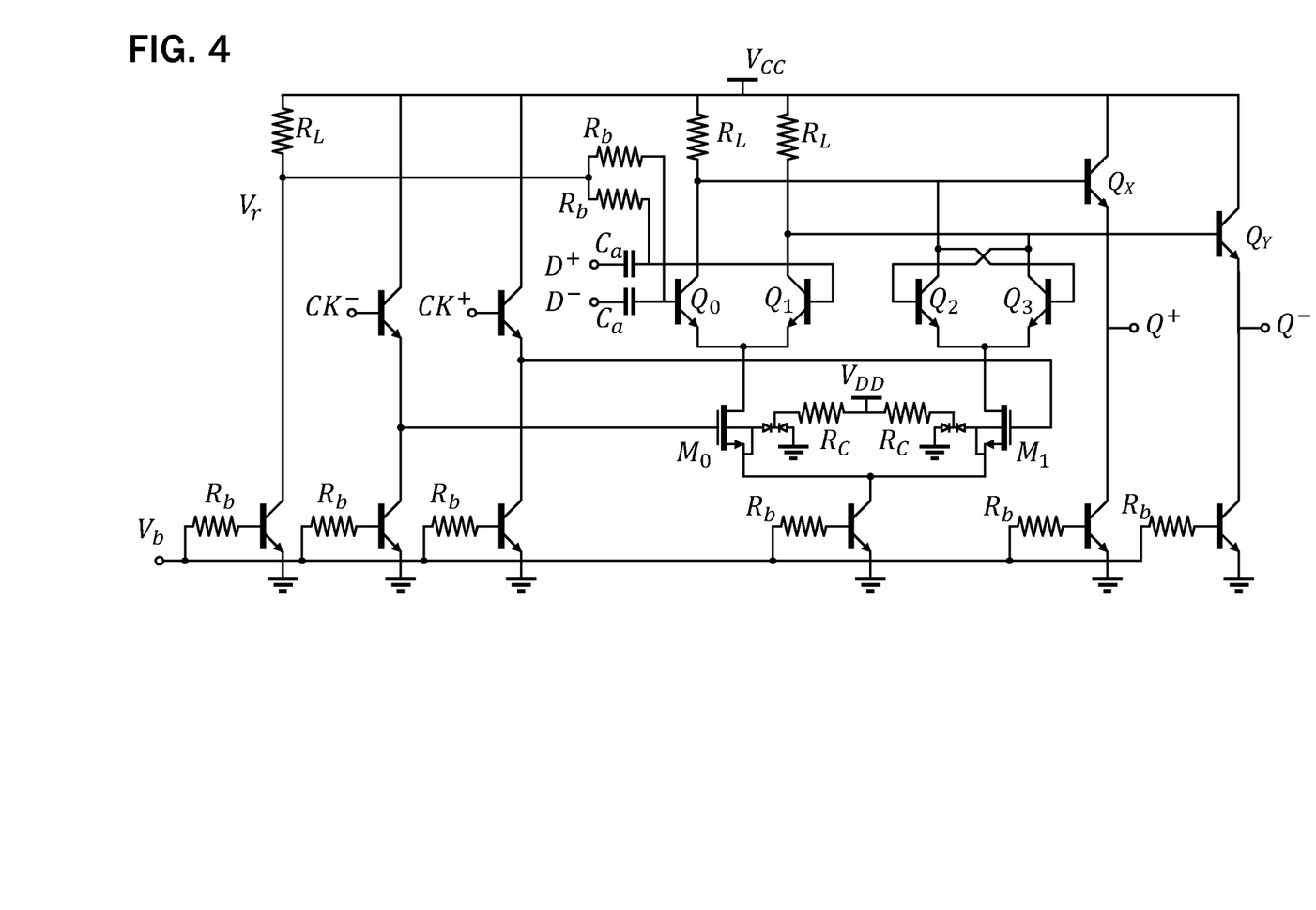
FIG. 4 is a schematic of an illustrative latch with AC-input coupling and enhanced biasing.

With the foregoing context, we now turn to FIG. 4, which is a schematic of an illustrative latch with AC-input coupling and enhanced biasing. The illustrative latch embodiment may be used to implement each of the three "regular" latches in the modulo-3 frequency divider of FIG. 2. The track pair transistors Q0, Q1 have their bases coupled to data inputs by AC-coupling capacitors Ca. DC-biasing of the track pair transistor bases are provided from a reference node Vr via base resistors Rb. The voltage of reference node Vr is determined by drawing a current from the supply voltage $V_{CC}$ through a load resistance $R_L$ using one of a set of bias transistors. To provide consistent performance that is more robust to PVT variation, each of the bias transistors is configured identically, with their emitters coupled to ground and their bases each coupled via a corresponding base resistor Rb to a bias node Vb. The voltage for the bias node Vb may be provided using a temperature-compensated bandgap voltage reference. Each of the base resistors are matched and each of the load resistors RL are matched to ensure that any PVT variations affect each of the circuit stages in a consistent fashion to preserve performance matching.

Another one of the set of bias transistors serves as the current sink for the clock pair transistors M0, M1. The base of clock pair transistor M0 receives the clock input from an emitter-follower configured transistor that amplifies the negative clock input CK−, while the base of clock pair transistor M1 receives its clock input from a matched emitter-follower configured transistor that amplifies the positive clock input CK+. These emitter-follower configured transistors have their collectors coupled to the supply voltage $V_{CC}$ and their emitters coupled to respective bias transistors in the matched set of bias transistors. As discussed with reference to FIG. 3, the clock pair transistors M0, M1 are implemented with a triple-well architecture using choke resistors Rc to reverse bias their isolation wells relative to their body wells (and to the substrate). The schematic includes representations of the parasitic diodes to model this reverse biasing technique.

The load resistances RL for the output nodes X, Y are matched to the load resistance for the reference voltage node Vr. An emitter-follower-configured transistor QX amplifies the signal from output node X, supplying the signal to node Q+. An emitter-follower-configured transistor QY amplifies the signal from output node Y, supplying the signal to node Q−. These emitter-follower configured transistors have their collectors coupled to the supply voltage $V_{CC}$ and their emitters coupled to respective bias transistors in the matched set of bias transistors.

As with the previously-described latch embodiment, the clock pair alternately enables the track pair Q0, Q1 to obtain the differential signal from data input nodes D+, D− and the latch pair Q2, Q3 to hold the signal on output nodes Q+, Q−.

Figure 5:
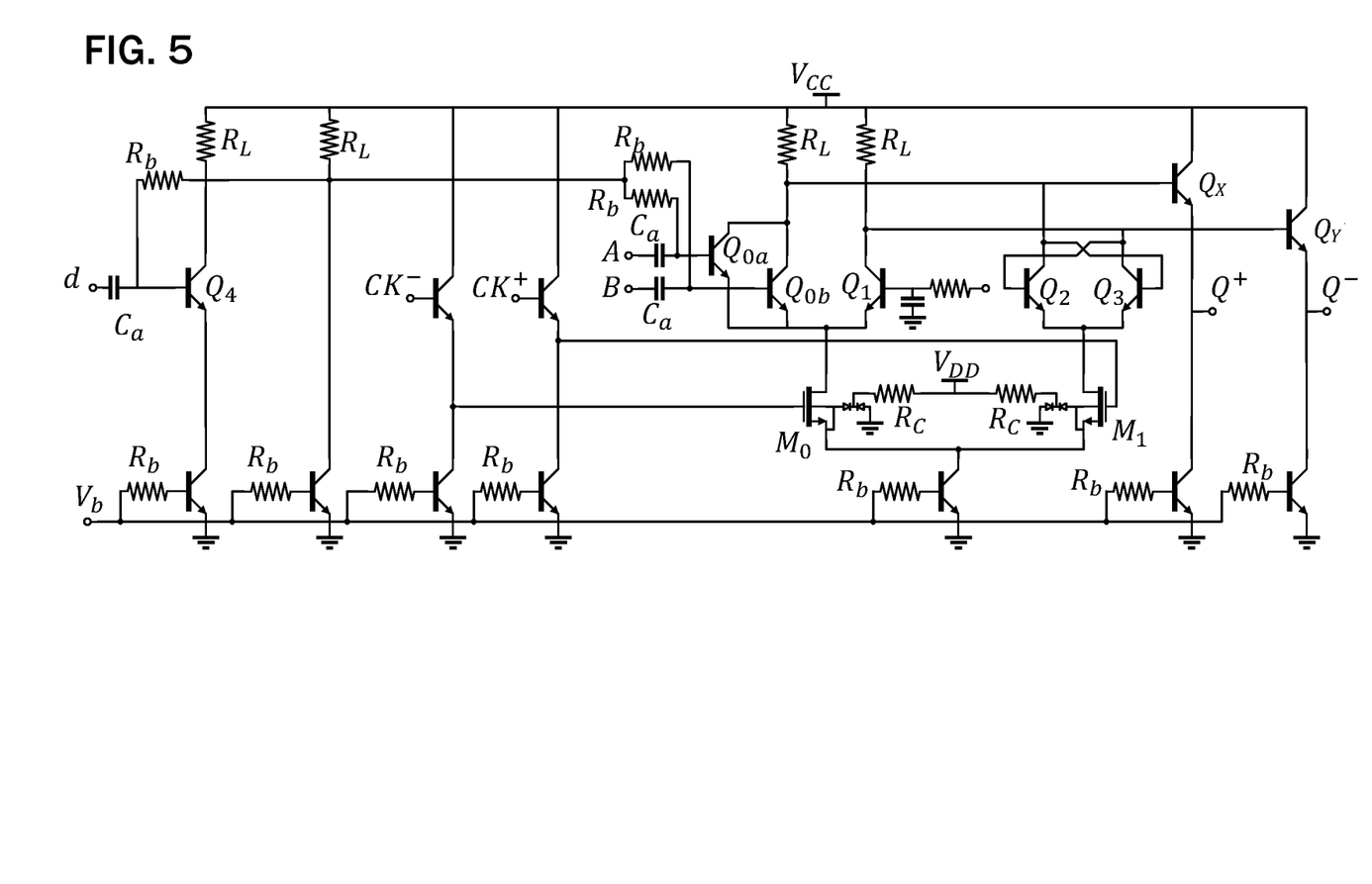
FIG. 5 is a schematic of an illustrative NOR-input latch with dummy loading.

FIG. 5 is a schematic of an illustrative modified latch that implements NOR functionality and dummy loading. It shares many of the components of the FIG. 4 embodiment, but the track pair transistor Q0 of FIG. 4 is replaced with two transistors Q0a, Q0b having their collectors connected in parallel to the output node X and their emitters connected in parallel to the drain of clock pair transistor M0. The base of transistor Q0a is coupled to signal input A with an AC coupling capacitance Ca, and the base of transistor Q0b is similarly coupled to signal input B with an AC coupling capacitance Ca. Each base is further coupled to the reference voltage node Vr by a base resistor Rb.

The complementary track pair resistor Q1 has its base coupled to ground with an AC coupling capacitance Cgnd, and coupled to the reference voltage node by a base resistor Rb. Because the data signal inputs in FIGS. 4 and 5 are AC coupled, they can be provided with a consistent reference voltage, thereby reducing sensitivity to PVT variations. AC coupling provides a further advantage in that the reference voltage can be chosen to provide more robust biasing of the clock pair transistors and their corresponding bias transistor.

As with the previously-described modified-latch embodiment, the assertion of signal inputs A or B (or both) causes the voltage of output node X to fall. The voltage of output node Y moves inversely to that of node X.

The schematic of FIG. 5 further includes a dummy input d that is coupled to the base of a transistor Q4 via an AC coupling capacitor Ca. This and each of the preceding capacitors Ca, Cgnd, may be implemented as on-chip metal-insulator-metal (MIM) plate capacitors. The base of transistor Q4 is further coupled via a base resistor Rb to the reference voltage node Vr. Transistor Q4 is biased by a load resistor RL coupling the collector to the supply voltage Vcc and a bias transistor from the set of matched bias transistors coupling the emitter to ground, so as to provide an input impedance that is matched to those for input signals A and B. The purpose of the dummy input is purely to provide an input impedance matching over the expected range of PVT variations, thereby reducing any load-induced variations in the positive and negative sides of the divider's output signal. Other implementations that provide similar load matching can also be used.

Thus, the following techniques are employed herein to provide potential advantages. (1) providing a consistent bias voltage for the track pair transistors Q0, Q1, and for the NOR input transistors Q0a, Q0b, relative to each other and the complementary transistor Q1. (2) providing increased leakage path impedance by biasing the isolation well(s) via choke resistor(s). (3) providing a dummy load to balance the loading of the divider's differential output signal nodes. The potential advantages include reduced sensitivity to PVT variation, reduced signal loss, and reduced phase and magnitude imbalance between the output signals. Taken individually or in combination, these potential advantages may provide improved yield, reduced supply voltage sensitivity, increased reliability (longer mean-time-to-failure), and higher maximum operating frequency.

A modulo-3 frequency divider having these advantages may improve the performance of fractional-N synthesizers that include a VCO, a reference clock, and a ΔΣ modulator-controlled multi-modulus divider, because there are fewer constraints on the selection of the VCO and reference clock frequency, enabling designs to be optimized for better performance in terms of phase noise, frequency range, and other performance parameters. Further, a simper ΔΣ modulator may be employed, enabling higher-frequency operation and reduced synthesizer phase noise. In the context of chirp generators in automotive radar applications, lower phase noise leads to better radar range and velocity resolution.

The disclosed frequency dividers can be implemented as integrated circuits in silicon, SiGe, and other semiconducting substrate materials. These and numerous other modifications, equivalents, and alternatives, will become apparent to those skilled in the art once the above disclosure is fully appreciated. It is intended that the following claims be interpreted to embrace all such modifications, equivalents, and alternatives where applicable.

What is claimed is:

1. An integrated circuit on a semiconductor substrate, the integrated circuit including a digital latch that comprises:
 a differential transistor pair ("track pair") capacitively coupled to a differential input signal to cause a differential output voltage between output nodes to track the differential input signal when a clock signal is asserted;
 a cross-coupled transistor pair ("latch pair") coupled to the output nodes to latch the differential output voltage when the clock signal is de-asserted;
 a differential transistor pair ("clock pair") that, responsive to the clock signal, steers a bias current between a shared emitter node of the track pair and a shared emitter node of the latch pair; and a matched set of bias transistors each having a base coupled by a respective base resistance to a shared bias voltage node, the matched set including:
  a first bias transistor that determines the bias current for the clock pair; and
  a second bias transistor that sources or sinks an equal bias current through a load resistance to determine a reference voltage on a reference voltage node,
the reference voltage node being coupled to a base of each transistor in the track pair by a bias resistance proportional to each of said base resistances to provide a bias voltage.

2. The integrated circuit of claim 1, wherein a voltage on the shared bias voltage node is determined by a bandgap voltage reference.

3. The integrated circuit of claim 1, wherein each of the output nodes is coupled to a supply voltage by a pull-up resistance equal to the load resistance.

4. The integrated circuit of claim 1, further comprising a first pair of emitter-follower-configured transistors that amplify the clock signal to drive gates of the transistors in the clock pair, the emitter-follower-configured transistors being biased by respective bias transistors in the matched set.

5. The integrated circuit of claim 4, further comprising a second pair of emitter-follower-configured transistors that buffer the differential output voltage for output, the emitter-follower-configured transistors in the second pair each being biased by respective bias transistors in the matched set.

6. The integrated circuit of claim 1, wherein at least one of the transistors in the clock pair is implemented with a triple-well architecture, and wherein the integrated circuit further comprises a choke resistor that reverse-biases an isolation well in the triple-well architecture.

7. The integrated circuit of claim 1, further comprising:
  a first master latch coupled to provide said differential input signal to said digital latch to implement a first flip flop; and
  a second flip flop including:
    a second master latch; and
    a slave latch capacitively coupled to receive output from the second master latch and coupled to provide a capacitively coupled differential input signal to the first master latch.

8. The integrated circuit of claim 7, wherein the second master latch is capacitively coupled to receive a first output signal from the digital latch and capacitively coupled to receive a second output signal from the slave latch, and wherein the second master latch produces a third output signal that is a logical NOR of the first output signal and the second output signal.

9. An integrated circuit on a semiconductor substrate, the integrated circuit including a modified digital latch that comprises:
  an input transistor arrangement that includes:
    a first input transistor having a base capacitively coupled to receive a first input signal;
    a second input transistor having a base capacitively coupled to receive a second input signal; and
    a complementary transistor having a base capacitively coupled to a fixed voltage node, the input transistor arrangement producing a differential output voltage between output nodes when a clock signal is asserted, the differential output voltage representing a logical NOR of the first and second input signals;
  a cross-coupled transistor pair ("latch pair") coupled to the output nodes to latch the differential output voltage when the clock signal is de-asserted;
  a differential transistor pair ("clock pair") that, responsive to the clock signal, steers a bias current between a shared emitter node of the track pair and a shared emitter node of the latch pair; and
  a matched set of bias transistors each having a base coupled by a respective base resistance to a shared bias voltage node, the matched set including:
    a first bias transistor that determines the bias current for the clock pair; and
    a second bias transistor that sources or sinks an equal bias current through a load resistance to determine a reference voltage on a reference voltage node,
  the reference voltage node being coupled to a base of each transistor in the input transistor arrangement by a bias resistance proportional to each of said base resistances to provide a bias voltage.

10. The integrated circuit of claim 9, wherein a voltage on the shared bias voltage node is determined by a bandgap voltage reference.

11. The integrated circuit of claim 9, wherein each of the output nodes is coupled to a supply voltage by a pull-up resistance equal to the load resistance.

12. The integrated circuit of claim 9, further comprising a first pair of emitter-follower-configured transistors that amplify the clock signal to drive gates of the transistors in the clock pair, the emitter-follower-configured transistors being biased by respective bias transistors in the matched set.

13. The integrated circuit of claim 12, further comprising a second pair of emitter-follower-configured transistors that buffer the differential output voltage for output, the emitter-follower-configured transistors in the second pair each being biased by respective bias transistors in the matched set.

14. The integrated circuit of claim 9, wherein at least one of the transistors in the clock pair is implemented with a triple-well architecture, and wherein the integrated circuit further comprises a choke resistor that reverse-biases an isolation well in the triple-well architecture.

15. The integrated circuit of claim 9, further comprising:
  a slave latch coupled to the modified digital latch to implement a flip flop, the flip flop providing a differential output between a positive output node and a negative output node.

16. The integrated circuit of claim 15, wherein the positive output node is coupled to the first input transistor as the first input signal, and wherein the modified digital latch further comprises a third input transistor having a base capacitively coupled to the negative output node to match loading of the positive output node.

17. A method of manufacturing a digital latch, the method comprising:
  capacitively coupling bases of a differential transistor pair ("track pair") to a differential input signal to cause a differential output voltage between output nodes to track the differential input signal when a clock signal is asserted;
  connecting a cross-coupled transistor pair ("latch pair") to the output nodes to latch the differential output voltage when the clock signal is de-asserted;
  providing a differential transistor pair ("clock pair") that, responsive to the clock signal, steers a bias current between a shared emitter node of the track pair and a shared emitter node of the latch pair; and biasing with a matched set of bias transistors each having a base coupled by a respective base resistance to a shared bias voltage node, the matched set including:
- a first bias transistor that determines the bias current for the clock pair; and
- a second bias transistor that sources or sinks an equal bias current through a load resistance to determine a reference voltage on a reference voltage node, the reference voltage node being coupled to a base of each transistor in the track pair by a bias resistance proportional to each of said base resistances to provide a bias voltage.

18. The method of claim 17, further comprising: coupling each of the output nodes to a supply voltage by a pull-up resistance equal to the load resistance.

19. The method of claim 17, further comprising: implementing the clock pair using a triple-well architecture; and reverse-biasing an isolation well in the triple-well architecture via a choke resistor.

20. The method of claim 17, further comprising: using bias transistors from the matched set to bias a first pair of emitter-follower-configured transistors that amplify the clock signal to drive gates of the transistors in the clock pair, and to bias a second pair of emitter-follower-configured transistors that buffer the differential output voltage for output.

* * * * *